United States Patent [19]
Moroni

[11] Patent Number: 6,057,191
[45] Date of Patent: May 2, 2000

[54] PROCESS FOR THE FABRICATION OF INTEGRATED CIRCUITS WITH CONTACTS SELF-ALIGNED TO ACTIVE AREAS

[75] Inventor: Maurizio Moroni, Rho, Italy

[73] Assignee: SGS-Thomson Microelectronics S.r.l., Agrate Brianza, Italy

[21] Appl. No.: 08/877,335

[22] Filed: Jun. 17, 1997

[30] Foreign Application Priority Data

Jun. 26, 1996 [EP] European Pat. Off. .............. 96830362

[51] Int. Cl.[7] ................................................. H01L 21/336
[52] U.S. Cl. ........................ 438/257; 438/265; 438/525; 438/302; 438/526
[58] Field of Search .................................. 438/525, 526, 438/302, 533, 529, 376, 257, 262

[56] References Cited

U.S. PATENT DOCUMENTS

| | | | |
|---|---|---|---|
| 4,107,719 | 8/1978 | Graul et al. ................................. | 357/15 |
| 4,357,178 | 11/1982 | Bergeron et al. ......................... | 148/1.5 |
| 4,535,532 | 8/1985 | Lancaster . | |
| 5,376,566 | 12/1994 | Gonzalez . | |
| 5,378,641 | 1/1995 | Cheffings . | |
| 5,426,063 | 6/1995 | Kaneko et al. . | |
| 5,459,085 | 10/1995 | Pasen et al. . | |
| 5,482,881 | 1/1996 | Chen et al. . | |
| 5,593,907 | 1/1997 | Anjum et al. . | |
| 5,624,859 | 4/1997 | Liu et al. . | |
| 5,670,392 | 9/1997 | Ferla et al. . | |

OTHER PUBLICATIONS

Ghandhi, S.K., VLSI Fabrication Principles, Silicon and Gallium Arsenide, pp. 731–734, 1994.

Wolf, S., Silicon Processing for the VLSI Era, vol. 1–Process Technology, 1986.

European Search Report from European Patent Application 96830362.8, filed Jun. 26, 1996.

Patent Abstract of Japan, vol. 017, No. 334 (E–1387), Jun. 24, 1993 & JP 05 041385, to Kiyoto.

Patent Abstract of Japan, vol. 96, No. 7, Jul. 31, 1996 & JP 08 078681 to Kunihiro.

Patent Abstract of Japan, vol. 13, No. 490 (E–841), Nov. 7, 1989 & JP 07 147327, to Takashi.

Patent Abstract of Japan, vol. 95, No. 009, Oct. 31, 1955 & JP 07 147327, to Akio.

*Primary Examiner*—Richard Booth
*Assistant Examiner*—Jonathan Hack
*Attorney, Agent, or Firm*—Wolf, Greenfield & Sacks, P.C.; James H. Morris; Theodore E. Galanthay

[57] ABSTRACT

A process for the manufacturing of integrated circuits provides for forming contacts between a conductive material layer and first doped regions of a semiconductor substrate in a self-aligned manner to edges of an insulating material layer which defines active areas of the integrated circuit wherein the doped regions are formed, and second doped regions of the same conductivity type as the first doped regions under the first doped regions, the second doped regions extending partially under the edges of the insulating material layer to prevent short-circuits between the conductive material layer and the semiconductor substrate. The second doped regions are formed by means of implantation of dopants along directions slanted with respect to an orthogonal direction to a surface of the semiconductor substrate at angles and with an energy sufficiently high to make the dopants penetrate in the semiconductor material deeper than the first doped regions and under the edges of the insulating material layer.

18 Claims, 1 Drawing Sheet

PROCESS FOR THE FABRICATION OF INTEGRATED CIRCUITS WITH CONTACTS SELF-ALIGNED TO ACTIVE AREAS

BRIEF DESCRIPTION OF THE DRAWINGS

1. Field of the Invention

The present invention relates to a process for the fabrication of integrated circuits with contacts self-aligned to active areas.

2. Discussion of the Related Art

In the field of integrated circuit manufacturing, some processes are known wherein the contact windows which allow, for example, metallization layers to come into contact with underlying doped regions of a semiconductor substrate are formed in a self-aligned manner to the active areas. In the technical jargon, active areas are portions of the semiconductor substrate wherein integrated components are formed by means of known techniques of dopant addition and redistribution, and correspond to regions of the semiconductor substrate surface wherein a thick field oxide layer which covers the remaining surface of the semiconductor substrate is not present.

Figure 1:
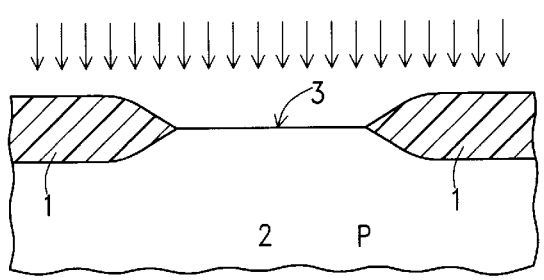
Figure 2:
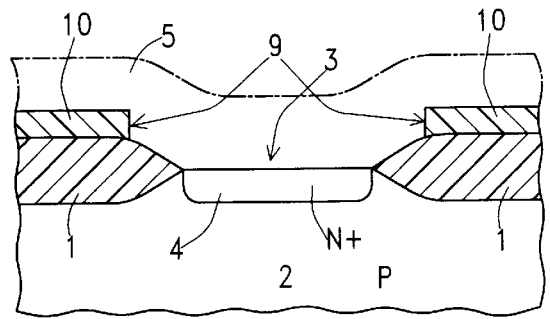

FIGS. 1 to 4 illustrate the process steps of interest of a conventional manufacturing process. Initially, a thick field oxide layer 1 (SiO2) is formed over the top surface of a semiconductor substrate 2, for example of P type. The field oxide layer 1 completely covers the surface of the substrate 2, except for selected areas 3 (active areas) wherein integrated components are to be formed. Conventionally, this can be achieved either by selective etching of the field oxide area (by means of a mask), or by means of selective growth of the field oxide layer 1, for example using the so-called LOCOS (local oxidation) technique (FIG. 1). Doped regions 4 are then formed in the active areas of the substrate 2. In the shown example, it is supposed that an N+ region 4 (e.g. $1020$–$1021$ atoms/cm$^3$) is formed in the active area 3 by means of dopant ion implantation followed by a thermal dopant diffusion process (FIGS. 1 and 2).

Region 4 is, in this example, the doped region of the substrate which is to be contacted by a metallization layer by means of a contact self-aligned to the active area 3. This means that the contact window 9 provided in a superimposed dielectric layer 10 is wider than the active area 3, so that a metallization layer 5 (indicated in dash-and-dot line of FIG. 2) disposed over the dielectric layer 10 contacts the N+ region 4 for the whole extension of the active area 3. This could cause short-circuits between the metallization layer 5 and the P type semiconductor substrate 2 at the edges of the field oxide layer 1.

Figure 3:
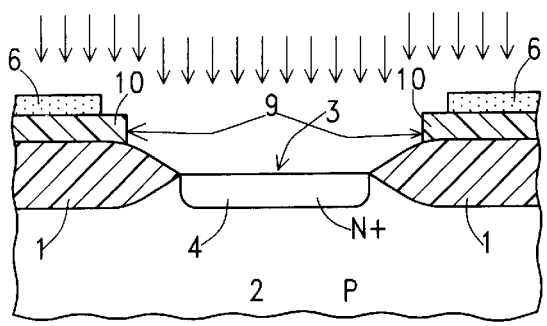
Figure 4:
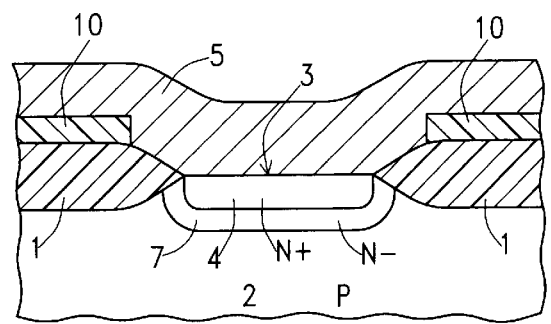

In order to prevent short-circuits between the metallization layer 5 and the semiconductor substrate 2, it is necessary to form, at the base of the contact area, a doped semiconductor region of the same conductivity type of the doped region to be contacted and with a prescribed doping level. In the known processes, this is obtained by means of a dedicated implant of dopants using one or more dedicated masks, and by means of a subsequent annealing treatment that causes the implanted dopants to diffuse. This is schematically shown in FIG. 3, wherein a photoresist layer 6 is deposited over the surface of the substrate 2, and is selectively etched, by means of a dedicated mask, to open a window of dimension at least equal to that of the contact window 9, and a prescribed dose of dopant ions is implanted at a prescribed energy through the window in the photoresist layer 6. The implanted dopant ions are then made to diffuse by means of a thermal process to obtain an N– region 7 (e.g. $1018$–$1019$ atoms/cm$^3$) under the N+ region 4, the N– region 7 slightly extending under the edges of the field oxide layer 1. A metallization layer 5 is then deposited over the field oxide layer 1 to contact the N+ region 4 in the whole active area 3. Short-circuits between the metallization layer 5 and the substrate 2 are thus prevented thanks to the fact that the N– region 7 partially extends under the edges of the field oxide layer 1.

It should be apparent that one or more dedicated masks, different from that used to open the contact windows 9 in the dielectric layer 10, are necessary; for example, if contacts are to be formed to both N type and P type doped regions, two different masks are necessary to form N– and P– regions at the base of the N type and P type contacts, respectively.

The necessity of additional masks increases the manufacturing cost of integrated circuits.

Additionally, the need for performing thermal processes substantially at the end of the manufacturing process of integrated circuits is also disadvantageous.

In view of the state of the art described, it is an object of the present invention to provide a process for the manufacturing of integrated circuits with contacts self-aligned to active areas which does not require additional masks.

SUMMARY OF THE INVENTION

According to the present invention, this and other objects are achieved by a process for the manufacturing of integrated circuits, providing for forming contacts between a conductive material layer and first doped regions of a semiconductor substrate in a self-aligned manner to edges of an insulating material layer, said edges defining active areas of the integrated circuit wherein said doped regions are formed, and second doped regions of the same conductivity type as said first doped regions under said first doped regions, said second doped regions extending partially under said edges of the insulating material layer to prevent short-circuits between the conductive material layer and the semiconductor substrate, wherein said second doped regions are formed by implantation of dopants along directions slanted with respect to an orthogonal direction to a surface of the semiconductor substrate at angles and with an energy sufficiently high to make the dopants penetrate in the semiconductor material deeper than said first doped regions and under said edges of the insulating material layer.

Thanks to the present invention, contacts self-aligned to active areas can be formed without the need for additional masks and thermal diffusion processes other than conventionally necessary to form the doped semiconductor regions constituting the integrated components.

BRIEF DESCRIPTION OF THE DRAWINGS

Figure 5:
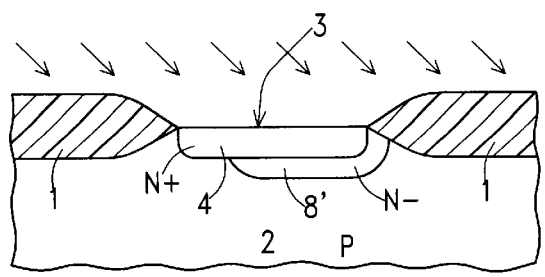
Figure 6:
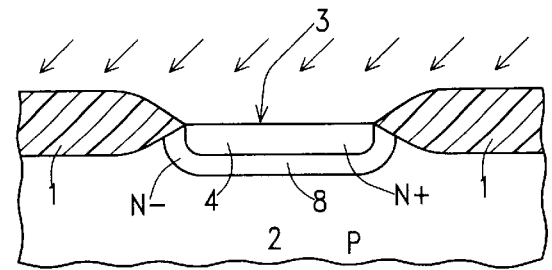

The features and advantages of the present invention will be made clearer by the following detailed description of a particular embodiment thereof, illustrated as a non-limiting example in the annexed drawings, wherein:

FIGS. 1 to 4 are cross-sectional views of a portion of an integrated circuit taken at intermediate steps of a conventional process; and FIGS. 5 and 6 are cross-sectional views of said portion of integrated circuit showing the characterizing steps of a process according to the present invention.

DETAILED DESCRIPTION

FIGS. 1 to 4 show, in cross-sectional view, a portion of an integrated circuit at intermediate steps of a process according to a conventional process for providing contacts self-aligned to active areas, as previously described.

The process according to the present invention is substantially similar to the conventional process previously described up to the formation of the doped region 4 inside an active area 3 (FIG. 2).

At this point, the process according to the present invention provides for performing two (in 30 this example) implantations of dopant ions of the same conductivity type as region 4, along directions symmetrically slanted at angles of approximately 30°–60° with respect to a direction orthogonal to the surface of the semiconductor substrate 2 (FIGS. 5 and 6) and at an energy of approximately 150–300 KeV, depending on the dopant used and on the depth of the region 4, higher than the energy used to implant the dopants which formed, after thermal diffusion, the N+ doped region 4. In this way, an N− region 8 is formed under the N+ region 4, said N− region 8 extending in depth more than region 4 (thanks to the higher implantation energy) and also extending slightly under the edges of the field oxide layer 1 (thanks to the slanted implantation directions). More precisely, by means of a first implantation along a direction slanted toward the right edge of the field oxide layer 1, an N− region 8' is formed which extends slightly under the right edge of the field oxide layer 1; region 8 is then completed by means of a second implantation along a direction slanted toward the left edge of the field oxide layer 1.

After the N− region 8 has been formed in the previously described way, a dielectric layer 10 is conventionally deposited over the field oxide layer 1 and contact windows 9 are formed in the dielectric layer 10. A metallization layer 5 is then deposited over the dielectric layer 10, the metallization layer 5 contacting the N+ doped region 4 for the whole extension of the active area 3, so that the contact area is self-aligned to the active area 3. Short-circuits between the metallization layer 5 and the substrate 2 are prevented thanks to the provision of the N− region 8 which partially extends under the edges of the field oxide layer 1.

It is important to note that the process of the present invention does not require any additional mask: the N− region 8 which prevents short-circuits between the metallization layer 5 and the semiconductor substrate 2 extends under the edges of the field oxide layer thanks to the fact that the dopants are implanted along slanted directions. Also, the process of the present invention does not require additional thermal diffusion processes to form the N− region 8: the desired depth of region 8 can be achieved by adjusting the dopant implantation energy.

The process of the present invention can find application in the fabrication of EPROM or Flash EEPROM memory devices, which as known comprise a matrix of memory cells comprising parallel N+ source diffusion lines intercalated by pairs of parallel polysilicon word lines, and parallel metal bit lines extending orthogonally to the source and word lines and contacting N+ drain diffusions extending under the metal bit lines orthogonally to said pairs of polysilicon word lines. The contacts between the metal bit lines and the underlying drain diffusions can advantageously be made self-aligned to the elongated edges of the drain diffusions. The two slanted implantations are thus made along directions lying in a plane parallel to the direction of the polysilicon word lines.

Even if in the present example two slanted implantation of dopants have been used to form the N− region 8, this is not to be intended as a limitation of the present invention: more generally, if a contact window of generic rectangular shape is to be formed so that each side of the contact window is self-aligned to edges of a field oxide layer defining an active area, it is necessary to perform four slanted implantations, one for each side of the contact window.

Having thus described at least one illustrative embodiment of the invention, various alterations, modifications, and improvements will readily occur to those skilled in the art. Such alterations, modifications, and improvements are intended to be within the spirit and scope of the invention. Accordingly, the foregoing description is by way of example only and is not intended as limiting. The invention is limited only as defined in the following claims and the equivalents thereto.

What is claimed is:

1. A process for manufacturing an integrated circuit, providing for forming contacts between a conductive material layer and first doped regions of a semiconductor substrate having edges aligned to edges of an opening in an insulating material layer, said edges of the opening in the insulating material layer defining active areas of the integrated circuit wherein said first doped regions are formed, and second doped regions of the same conductivity type as said first doped regions disposed under said first doped regions, said second doped regions extending partially under said edges of the opening in the insulating material layer to prevent short-circuits between the conductive material layer and the semiconductor substrate, wherein said second doped regions are formed by implanting dopants along a direction at a first angle with respect to an orthogonal direction to a surface of the semiconductor substrate and with an energy sufficient to make the dopants penetrate in the semiconductor material deeper than said first doped regions and under said edges of the insulating material layer.

2. The process according to claim 1, wherein said first angle is from approximately 30–60 degrees with respect to said orthogonal direction.

3. The process according to claim 2, wherein said energy is from approximately 150–300 keV.

4. The process according to claim 3, wherein said insulating material layer is a field silicon dioxide layer.

5. The process according to claim 4, wherein said conductive material layer is a metallization layer.

6. The process according to claim 5, wherein said semiconductor substrate is of the opposite conductivity type of said first and second doped regions.

7. The process according to claim 1, wherein the integrated circuit is one of an EPROM and an EEPROM device.

8. The process according to claim 1, further comprising:
implanting dopants along a second direction at a second angle with respect to the orthogonal direction.

9. The process according to claim 8, wherein the second angle is perpendicular to the first angle.

10. A method for providing an insulating doped region in a semiconductor substrate of a first conductivity type including an oxide layer disposed on a top surface of the semiconductor substrate defining at least one selected exposed area of said top surface, a first doped active region of a second conductivity type being formed in the at least one selected exposed area of the semiconductor substrate, the method comprising steps of:

creating the first doped active region such that edges of the first doped active region are aligned with respective edges of the at least one selected exposed area of the semiconductor substrate;

creating the insulating doped region within the semiconductor substrate and under the first doped active region by providing first dopant ions of the first semiconductor type to the top surface of the semiconductor substrate at a first angle other than normal to the top surface of the semiconductor substrate and with an implant energy sufficient to make the first dopant ions penetrate in the semiconductor material deeper than the first doped active region, wherein the insulating doped region extends under edges of the oxide layer; and providing a metallization layer over the upper surface of the semiconductor substrate, wherein the metallization layer is electrically isolated from the semiconductor substrate by the insulating doped region.

11. The method as recited in claim 10, wherein the first angle is in a range from 30°–60° with respect to normal to the top surface.

12. The method as recited in claim 10, wherein an implant energy of the dopant ions is sufficient to create the insulating doped region below the first doped active region.

13. The method as recited in claim 10, wherein:

a first portion of the insulating doped layer is created by the dopant ions provided at the first angle; and a second portion of the insulating doped layer is created by providing second dopant ions of the first conductivity type to the top surface at a second angle perpendicular to the first angle.

14. The method as recited in claim 12, wherein the implantation energy is in a range from approximately 150–300 keV.

15. The method as recited in claim 10, wherein the insulating doped region is lightly doped relative to the first doped active region.

16. A method of disposing a first doped region of a first conductivity type within a semiconductor substrate of a second conductivity type and aligning the first doped region with an active area of an oxide layer disposed on a top surface of the semiconductor substrate, an active region being disposed in the semiconductor substrate in the active area, the method comprising steps of:

aligning edges of the active region with edges of the oxide layer defining the active area;

providing dopant ions of the first conductivity type to the active region in the oxide layer in the top surface of the semiconductor substrate at an angle less than normal to the top surface of the semiconductor substrate, and implanting the dopant ions in the semiconductor substrate to create the first doped region; and providing a metallization layer over the upper surface of the semiconductor substrate, wherein the first doped region is disposed under the active region and extends under edges of the oxide layer defining the active area, and wherein the metallization layer is electrically isolated from the semiconductor substrate by the first doped region.

17. The method as recited in claim 16, wherein the first angle is in a range from 30°–60° with respect to normal to the top surface, and wherein the dopant ions are provided with an implant energy sufficient to make the dopant ions penetrate in the semiconductor substrate deeper than the active area.

18. The method as recited in claim 16, wherein the first conductivity type is an opposite of the second conductivity type.

* * * * *